(12) United States Patent
Choi et al.

(10) Patent No.: US 9,872,385 B2
(45) Date of Patent: Jan. 16, 2018

(54) COPPER CLAD LAMINATE, PRINTED CIRCUIT BOARD INCLUDING THE SAME, AND MANUFACTURING METHOD OF THE SAME

(71) Applicants: Hyundai Motor Company, Seoul (KR); Kia Motors Corporation, Seoul (KR)

(72) Inventors: Seung Woo Choi, Seoul (KR); Sung Cheul Jeong, Gyeonggi-do (KR); Ho Sub Kim, Seoul (KR); Young Do Kim, Daejeon (KR); Cheol Ho Kim, Chungcheongbuk-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/180,472

(22) Filed: Jun. 13, 2016

(65) Prior Publication Data
US 2017/0245364 A1 Aug. 24, 2017

(30) Foreign Application Priority Data
Feb. 24, 2016 (KR) .......................... 10-2016-0022159

(51) Int. Cl.
*H05K 1/03* (2006.01)
*H05K 1/09* (2006.01)
(Continued)

(52) U.S. Cl.
CPC .............. *H05K 1/09* (2013.01); *B32B 15/08* (2013.01); *B32B 15/20* (2013.01); *H05K 1/028* (2013.01);
(Continued)

(58) Field of Classification Search
CPC .......... H05K 1/0353; H05K 2201/0129; B32B 27/00; B32B 27/08; B32B 27/32; B32B 15/08; C23C 30/005; C08J 2379/08
See application file for complete search history.

(56) References Cited

U.S. PATENT DOCUMENTS

| 6,251,507 | B1 | 6/2001 | Yamamoto et al. |
| 6,379,784 | B1* | 4/2002 | Yamamoto ............ B32B 27/34 156/308.2 |
| 2001/0055691 | A1* | 12/2001 | Yamamoto ............ B32B 15/08 428/473.5 |
| 2002/0031868 | A1* | 3/2002 | Capote .................. H01L 21/563 438/126 |
| 2010/0128459 | A1 | 5/2010 | Loibl et al. |
| 2011/0114371 | A1* | 5/2011 | Lin ......................... B32B 7/12 174/254 |

(Continued)

FOREIGN PATENT DOCUMENTS

| JP | 2014-195947 A | 10/2014 |
| JP | 2016-097677 A | 5/2016 |

(Continued)

OTHER PUBLICATIONS

European Search Report for European Patent Application No. 16173249, dated Jul. 22, 2016, 11 pages.

*Primary Examiner* — Hoa C Nguyen
(74) *Attorney, Agent, or Firm* — Mintz Levin Cohn Ferris Glovsky and Popeo, P.C.; Peter F. Corless (57) ABSTRACT

Disclosed is a flexible copper clad laminate including a first copper foil layer, a composite layer, and a second copper foil layer. Preferably, the composite layer includes a polyimide layer and a plurality of thermoplastic polyimide layers as an outermost layer thereof being the thermoplastic polyimide layers. In particular, with respect to a total thickness of the composite layer, a total thickness of the plurality of thermoplastic polyimide layers is in a range of from about 15 to about 50%, and a total thickness of the polyimide layer is in a range of from about 50 to about 85%. Each thickness of the first copper foil layer and the second copper foil layer is in a range of from about 30 to about 80 μm, and the total thickness of the composite layer is in a range of from about 40 to about 60 μm.

10 Claims, 2 Drawing Sheets

(51) Int. Cl.
    *H05K 1/02*     (2006.01)
    *H05K 3/00*     (2006.01)
    *H05K 3/46*     (2006.01)
    *B32B 15/08*     (2006.01)
    *B32B 15/20*     (2006.01)

(52) U.S. Cl.
    CPC ......... H05K 1/0353 (2013.01); H05K 3/0014 (2013.01); H05K 3/4611 (2013.01); *B32B 2250/40* (2013.01); *B32B 2307/306* (2013.01); *B32B 2307/546* (2013.01); *B32B 2307/732* (2013.01); *B32B 2307/734* (2013.01); *B32B 2457/08* (2013.01); *B32B 2605/08* (2013.01); *H05K 2201/0129* (2013.01); *H05K 2201/068* (2013.01)

(56) References Cited

U.S. PATENT DOCUMENTS

2011/0229680 A1    9/2011    Glenn et al.
2012/0155055 A1*    6/2012    Kang .................... H05K 1/113
                                                               361/820

FOREIGN PATENT DOCUMENTS

KR    10-2001-0093746 A    10/2001
KR    10-2012-0040422 A    4/2012
KR    10-2012-0134666 A    12/2012

* cited by examiner

COPPER CLAD LAMINATE, PRINTED CIRCUIT BOARD INCLUDING THE SAME, AND MANUFACTURING METHOD OF THE SAME

CROSS-REFERENCE TO RELATED APPLICATION

This application claims priority to and the benefit of Korean Patent Application No. 10-2016-0022159 filed in the Korean Intellectual Property Office on Feb. 24, 2016, the entire contents of which are incorporated herein by reference.

BACKGROUND OF THE INVENTION (a) Field of the Invention

The present invention relates to a copper clad laminate, a printed circuit board including the same, and a manufacturing method thereof.

(b) Description of the Related Art

Currently, in a vehicle, various electrical/electronic elements have been applied in addition to conventional mechanical elements to implement a precise control system, and a role occupied by the electrical/electronic elements and devices of the vehicle has been recognized as being very important.

Further, because the vehicle can be a living space as well as a transportation means, introduction of more advanced and various convenience devices to ensure safety and improve performance has been carried out. However, when the number of electronic control items of the vehicle is increased and the number of parts is increased, an amount of wiring and a wire harness may be increased. Thus, when the wiring and associated parts may be increased, the probability of failure may also be increased and the weight of the vehicle becomes heavy, thereby deteriorating fuel consumption. For this reason, reliability and down-sizing may be suggested by replacing the conventional wiring harness by a flexible printed circuit board (FPCB) such that electrical equipment of the vehicle can be extensively used in and out the vehicle.

Recently, to ensure driving performance and fuel efficiency, an electrical control technique of the vehicle transmission has been developed, such that impact absorbing control during shifting and a control technique for driving torque improvement have mainly been developed. Thus, in order to ensure stability and provide many electrical functions in a very limited space of the transmission itself, a flexible printed circuit board may be applied, and thus, high reliability may be required for a flexible copper clad laminate (FCCL) that may be used as a base material of the flexible printed circuit board. Particularly, since the vehicle transmission is driven in a mixed environment of a high temperature of greater than about 150° C. and violent vibration, the FCCL may need dimensional stability in a long-term high-temperature condition, flex resistance against the severe vibration condition, and an adherence force after oil contact.

The foregoing is intended merely to aid in the understanding of the background of the present invention, and is not intended to mean that the present invention falls within the purview of the related art that is already known to those skilled in the art.

SUMMARY OF THE INVENTION

Thus, in preferred aspect, the present invention provides a copper clad laminate and a printed circuit board including the same. The copper clad laminate may be flexible, which may be provided by a substantially reduced thickness of components constituting the laminated structure, and thus prepared printed circuit board may also be flexible.

The term "flexible" is meant by easily being bent, modified, altered, or adjustable by a force or pressure without breaking thereby providing suitably physical properties (e.g. dimensional stability and flex resistance). In certain embodiments, the flexible copper clad laminate in the present invention may not be easily breakable as being bent, modified, altered or adjusted by a force applied thereon. Unless otherwise indicated herein, the copper clad laminate in the present invention may be flexible thereby indicating a flexible copper clad laminate.

In one aspect, the present invention provides a flexible copper clad laminate having excellent dimensional stability, flex resistance, and adherence after oil contact, and a manufacturing method thereof.

In another aspect, the present invention provides a flexible printed circuit board comprising the flexible copper clad laminate having the excellent dimensional stability, flex resistance, and adherence after the oil contact.

A flexible copper clad laminate according to an exemplary embodiment of the present invention may comprise a first copper foil layer, a composite layer, and a second copper foil layer, and the first copper foil layer, the composite layer, and the second copper foil layer may be sequentially stacked. The composite layer may comprise a polyimide layer and a plurality of thermoplastic polyimide layers, and an outermost layer of the composite layer may be one of the plurality of the thermoplastic polyimide layers.

Preferably, a total thickness of the plurality of the thermoplastic polyimide layers may be in a range of from about 15 to about 50% with respect to a total thickness of the composite layer, and a total thickness of the polyimide layer may be in a range of from about 50 to about 85% with respect to the total thickness of the composite layer. In detail, the total thickness of the plurality of the thermoplastic polyimide layers may be in a range of from about 20 to about 40% with respect to a total thickness of the composite layer, and the total thickness of the polyimide layer may be in a range of from about 60 to about 80% with respect to the total thickness of the composite layer. Particularly, the total thickness of the plurality of the thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

Each thickness of the first copper foil layer and the second copper foil layer may be in a range of from about 30 to about 80 μm, and the total thickness of the composite layer may be in a range of from about 40 to about 60 μm.

A tensile modulus of the composite layer may be in a range of from about 4.5 to about 5.5 GPa, and a linear coefficient of thermal expansion (CTE) may be in a range of from about 20 to about 30 ppm/° C.

In the composite layer, the polyimide layer and the plurality of thermoplastic polyimide layers may be alternately stacked. Further, the polyimide layer suitably may be made of n layers, the plurality of thermoplastic polyimide layers may be made of (n+1) layers, and n may be from 1 to 5.

The polyamic acid solution according to an exemplary embodiment of the present invention suitably may be formed by mixing a dianhydride and a diamine in an organic solvent with a molar ratio from about 1:0.9 to about 1:1.1.

When forming the polyamic acid solution of the present invention, the polyimide-based resin having a desired linear coefficient of thermal expansion (CTE) or modulus may be obtained by controlling a mixture ratio of the dianhydride and the diamine, or a mixture between the dianhydrides or between the diamines, or by adjusting a kind of the selected dianhydride and diamine.

The dianhydride according to an exemplary embodiment of the present invention may include one or two or more selected from the group consisting of PMDA (pyromellitic dianhydride), BPDA (3,3',4,4'-biphenyl tetracarboxylic dianhydride), BTDA (3,3',4,4'-benzophenone tetracarboxylic dianhydride), ODPA (4,4'-oxydiphthalic anhydride), ODA (4,4'-diaminodiphenyl ether), BPADA (4,4'-(4,4'-isopropyl bi phenoxy)biphthalic anhydride), 6FDA (2,2'-bis-(3,4-dicarboxylic phenyl) hexafluoropropane dianhydride), and TMEG (ethylene glycol bis(anhydro-trimellitate).

The diamine according to an exemplary embodiment of the present invention may include one or two or more kinds selected from the group consisting of PDA (p-phenylene diamine), m-PDA (m-phenylene diamine), 4,4'-ODA (4,4'-oxydianiline), 3,4'-ODA (3,4'-oxydianiline), BAPP (2,2-bis(4-[4-aminophenoxy]-phenyl)propane), TPE-R (1,3-bis(4-aminophenoxy)benzene), BAPB (4,4'-bis(4-aminophenoxy) biphenyl), m-BAPS (2,2-bis(4-[3-aminophenoxy]phenyl) sulfone), HAB (3,3'-dihydroxy-4,4'-diaminobiphenyl), and DABA (4,4'-diamino-benz anilide).

In addition, an amount of other dianhydrides and diamines or other compounds may be further added with the compounds described above.

A manufacturing method of a flexible copper clad laminate according to an exemplary embodiment of the present invention may comprise steps of: preparing a first copper foil layer; casting and drying a first thermoplastic polyimide precursor resin on the first copper foil layer to form a first thermoplastic polyimide precursor layer; casting and drying a polyimide precursor resin on the first thermoplastic polyimide precursor layer to form a polyimide precursor layer; casting and drying a second thermoplastic polyimide precursor resin on the polyimide precursor layer to form a second thermoplastic polyimide precursor layer; curing, by a heat treatment, the first thermoplastic polyimide precursor layer, the polyimide precursor layer, and the second thermoplastic polyimide precursor layer to form a composite layer; and stacking a second copper foil layer on the second thermoplastic polyimide layer.

Preferably, a total thickness of the first thermoplastic polyimide layer and a thickness of the second thermoplastic polyimide layer may be in a range of from about 15 to about 50% with respect to the total thickness of the composite layer, and a total thickness of the polyimide layer may be in a range of from about 50 to about 85% with respect to the total thickness of the composite layer. In detail, the total thickness of the first thermoplastic polyimide layer and the thickness of the second thermoplastic polyimide layer may be in a range of from about 20 to about 40% with respect to the total thickness of the composite layer, and the total thickness of the polyimide layer may be in a range of from 60 to 80% with respect to the total thickness of the composite layer. Particularly, the total thickness of the first and second thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

Each of a thickness of the first copper foil layer and a thickness of the second copper foil layer thickness may be in a range of from about 30 to about 80 μm, and a thickness of the composite layer may be in a range of from about 40 to about 60 μm.

A tensile modulus of the composite layer may be in a range of from about 4.5 to about 5.5 GPa, and a linear coefficient of thermal expansion (CTE) may be in a range of from about 20 to about 30 ppm/° C.

The step forming the first thermoplastic polyimide precursor layer and the step forming the polyimide precursor layer may be suitably performed repeatedly 1 to 5 times.

Further provided is a flexible printed circuit board that may comprise the above-described flexible copper clad laminate. Additionally, the present invention provides a vehicle that may comprise the flexible printed circuit board as described above.

The flexible printed circuit board according to an exemplary embodiment of the present invention suitably may be a flexible printed circuit board used for a vehicle transmission.

The flexible copper clad laminate according to an exemplary embodiment of the present invention may have the excellent bending characteristic and the excellent dimensional stability, and a curl of the composite layer may be low.

In the flexible copper clad laminate according to an exemplary embodiment of the present invention, the outermost layer of the composite layer may be the thermoplastic polyimide layer such that the high adherence may be maintained in a long-term high temperature environment.

In the flexible printed circuit board according to an exemplary embodiment of the present invention, the bending characteristic may be substantially improved such that a crack may be prevented in the circuit exposed to the severe vibration environment such as the transmission for the vehicle.

The flexible printed circuit board according to an exemplary embodiment of the present invention may have substantially improved dimensional stability and adherence in long-term thermal resistance (for example, at a temperature of about 130° C. or greater), which is required for the vehicle electrical equipment mounted in an engine compartment, and thus, the bending may not be generated.

BRIEF DESCRIPTION OF THE DRAWINGS

It should be understood that the accompanying drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DESCRIPTION OF SYMBOLS

100: flexible copper clad laminate
11: first copper foil layer

12: second copper foil layer
20: composite layer
21: thermoplastic polyimide layer
22: polyimide layer

DETAILED DESCRIPTION

The advantages and features of the present invention and the methods for accomplishing the same will be apparent from the exemplary embodiments described hereinafter with reference to the accompanying drawings. However, the present invention is not limited to the exemplary embodiments described hereinafter, but may be embodied in many different forms. The following exemplary embodiments are provided to make the invention of the present invention complete and to allow those skilled in the art to clearly understand the scope of the present invention, and the present invention is defined only by the scope of the appended claims. Throughout the specification, the same reference numerals denote the same elements.

In some exemplary embodiments, detailed description of well-known technologies will be omitted to prevent the invention of the present invention from being interpreted ambiguously. Unless otherwise defined, all terms (including technical and scientific terms) used herein have the same meaning as commonly understood by one of ordinary skill in the art.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Figure 1:
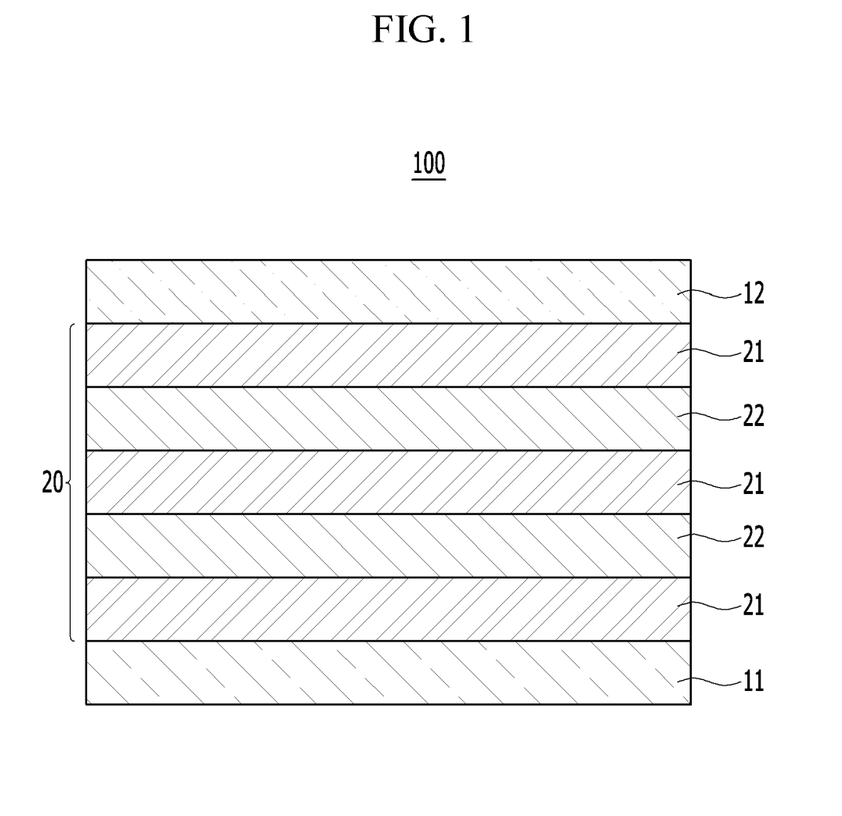
FIG. 1 illustrates a structure of an exemplary flexible copper clad laminate according to an exemplary embodiment of the present invention.

FIG. 1 illustrates a structure of an exemplary flexible copper clad laminate according to an exemplary embodiment of the present invention.

In the flexible copper clad laminate 100 according to an exemplary embodiment of the present invention, a first copper foil layer 11, a composite layer 20, and a second copper foil layer 12 may be sequentially stacked. In particular, the composite layer 20 may comprise a polyimide layer 22 and a plurality of thermoplastic polyimide layers 21, and an outermost layer of the composite layer 20 may be one of the plurality of the thermoplastic polyimide layers 21.

In an exemplary embodiment of the present invention, productivity may be obtained by the multi-layered structure of the composite layer 20, and the outermost layer of the composite layer 20 may be coated to be the thermoplastic polyimide layer 21 to increase the adherence with the first copper foil layer 11 and the second copper foil layer 12.

A low modulus may be required for the flexible copper clad laminate (FCCL) 100 having the excellent bending characteristic. For this, although the polyimide (PI) having a low modulus is coated, as the modulus is low, a physical characteristic such as the dimensional stability (required level of ±<0.1%) required by the flexible copper clad laminate 100 may not be obtained and curl (±<10 mm) of the composite layer 20 after etching a Cu layer due to a characteristic that a coefficient of thermal expansion (CTE) may be increased.

In an exemplary embodiment of the present invention, by suitably adjusting a thickness ratio of the thermoplastic polyimide layer 21 having a low modulus and the polyimide layer 22 having a high modulus, the modulus of the entire composite layer 20 may be reduced. Preferably, the tensile modulus of the composite layer 20 required for the flexible printed circuit board (FPCB) of the transmission may be in a range of from about 4.5 to about 5.5 GPa. When the modulus is greater than about 5.5 GPa, bending characteristic thereof may be reduced. In detail, the tensile modulus of the composite layer 20 may be in a range of from about 4.7 to about 5.0 GPa. For this, with respect to the total thickness of the composite layer 20, the total thickness of the plurality of the thermoplastic polyimide layers 21 may be in a range of from about 15 to about 50%, and with respect to the total thickness of the composite layer 20, the thickness of the polyimide layer 22 may be in a range of from about 50 to about 85%. In the composite layer 20, as the thickness ratio of the thermoplastic polyimide layer 21 is increased, the modulus may be decreased, however when the thickness ratio of the thermoplastic polyimide layer 21 is increased, the dimensional stability may not be obtained due to the high CTE. In contrast, in the entire composite layer 20, when the thickness ratio of the thermoplastic polyimide layer 21 is substantially reduced, the modulus may increase substantially such excellent bending characteristic may not be obtained and the adherence of copper between the foil layers 11 and 12 and the composite layer 20 may be reduced at a high temperature. The linear coefficient of thermal expansion (CTE) of the composite layer 20 may be in a range of from about 20 to about 30 ppm/° C.

In detail, with respect to the thickness of the composite layer 20, the total thickness of the plurality of the thermoplastic polyimide layers 21 may be in a range of from about 20 to about 40%, and the thickness of the polyimide layer 22 may be in a range of from about 60 to about 80%. Further, exemplary total thickness of the plurality of the thermoplastic polyimide layers may be in a range of from about 30 to about 40% with respect to the total thickness of the composite layer, and accordingly exemplary total thickness of the polyimide layer may be in a range of from about 60 to about 70% with respect to the total thickness of the composite layer. To obtain the excellent bending characteristic and dimensional stability, the thermoplastic polyimide layer 21 having a low modulus and the polyimide layer 22 having a high modulus suitably may be alternately deposited. FIG.

1 shows an example in which the thermoplastic polyimide layer 21 and the polyimide layer 22 are alternately deposited.

The polyimide layer 22 may suitably comprise n layers, the thermoplastic polyimide layer 21 may comprise of (n+1) layers, and n may be from 1 to 5, or particularly, n may be from 2 to 5. However, when n is 1, the thickness of the polyimide layer 22 coated one time may become thick such that an appearance defect such as a bubble (blister) generation in the polyimide layer 22 during the coating and the hardening may be generated and a process speed may be lowered during drying/hardening of the thick polyimide layer, thereby deteriorating the productivity. When n is greater than the predetermined number, for example, greater than 5, the number of the coated polyimide layers may be excessively increased such that the productivity may be decreased. FIG. 1 shows the case that n is 2 as one example.

The first copper foil layer 11 and the second copper foil layer 12 may include a rolled or electrolytic copper foil of many copper foil thicknesses and types, and other metal foils instead of the copper foil layer may be used. In this case, as the first copper foil layer 11 and the second copper foil layer 12 may be the copper foil of the same components, a stress deformation that occurs because of different coefficients of thermal expansion may be avoided. Each thickness of the first copper foil layer 11 and the second copper foil layer 12 may be from about 30 to about 80 μm.

According to an exemplary embodiment of the present invention, the plurality of thermoplastic polyimide layers 21 and the polyimide layer 22 may be manufactured by forming and imidizing a polyamic acid solution having physical characteristics such as a targeted linear coefficient of thermal expansion or tensile modulus as the precursor layer. The used polyamic acid solution is not limited as long as it is a polyamic acid solution commonly used in the art within the technical category of the present invention.

The polyamic acid solution according to an exemplary embodiment of the present invention may be manufactured by mixing a dianhydride and a diamine at a molar ratio of about 1:0.9 to 1:1.1 in an organic solvent. When manufacturing the polyamic acid solution of the present invention, the polyimide-based resin having the desired linear coefficient of thermal expansion (CTE) or the tensile modulus may be obtained by controlling the mixture ratio of the dianhydride and the diamine, the mixture ratio between the dianhydrides and the diamines, or the kinds of the selected dianhydride and diamine.

The dianhydride suitable for the exemplary embodiment of the present invention may include one or more selected from the group consisting of PMDA (pyromellitic dianhydride), BPDA (3,3',4,4'-biphenyl tetracarboxylic dianhydride), BTDA (3,3',4,4'-benzophenone tetracarboxylic dianhydride), ODPA (4,4'-oxydiphthalic anhydride), ODA (4,4'-diaminodiphenyl ether), BPADA (4,4'-(4,4'-isopropyl bi phenoxy)biphthalic anhydride), 6FDA (2,2'-bis-(3,4-dicarboxylic phenyl) hexafluoropropane dianhydride), and TMEG (ethylene glycol bis(anhydro-trimellitate).

The diamine suitable to the exemplary embodiment of the present invention may include one or more selected from the group consisting of PDA (p-phenylene diamine), m-PDA (m-phenylene diamine), 4,4'-ODA (4,4'-oxydianiline), 3,4'-ODA (3,4'-oxydianiline), BAPP (2,2-bis(4-[4-aminophenoxy]-phenyl)propane), TPE-R (1,3-bis(4-aminophenoxy) benzene), BAPB (4,4'-bis(4-aminophenoxy)biphenyl), m-BAPS (2,2-bis(4-[3-aminophenoxy]phenyl)sulfone), HAB (3,3'-dihydroxy-4,4'-diaminobiphenyl), and DABA (4,4'-diamino-benzanilide).

If necessary, small amounts of other dianhydrides and diamines or other compounds may be added to the compounds described above. The total thickness of the composite layer 20 may be of about 40 to 60 μm. The bending characteristic and the dimensional stability may be obtained in the above-described range.

A manufacturing method of a flexible copper clad laminate according to an exemplary embodiment of the present invention may comprise steps of: preparing a first copper foil layer; casting and drying a first thermoplastic polyimide precursor resin on the first copper foil layer to form a first thermoplastic polyimide precursor layer; casting and drying a polyimide precursor resin on the first thermoplastic polyimide precursor layer to form a polyimide precursor layer; casting and drying a second thermoplastic polyimide precursor resin on the polyimide precursor layer to form a second thermoplastic polyimide precursor layer; curing, by a heat treatment, the first thermoplastic polyimide precursor layer, the polyimide precursor layer, and the second thermoplastic polyimide precursor layer to form a composite layer; and stacking a second copper foil layer on the second thermoplastic polyimide layer.

Hereafter, each step will be described in detail.

Firstly, the first copper foil layer is prepared. The first copper foil layer is the same as those described above such that the repeated description thereof is omitted.

Next, the first thermoplastic polyimide precursor resin may be casted and dried on the first copper foil layer to form the first thermoplastic polyimide precursor layer. Without limiting to the particular manufacturing method, coating or casting method for the thermoplastic polyimide precursor layer may include a sputtering method, a lamination method, and a casting method. For example, the sputtering method may cause expensive high process cost and adhesive strength with the polyimide layer may not be obtained while filming the copper foil layer with a uniform thickness. The exemplary embodiment of the present invention uses the casing method. In general, when thickly coating the liquid polyimide to the copper foil layer, the productivity may be reduced due to the low process speed. Also, a curing degree may be reduced due to the thick thickness during heat curing such that the mechanical strength and the chemical resistance may be decreased, and removal of the solvent existing in the interior of the film may be difficult such that the appearance defect such as a foaming phenomenon may appear and the dimensional stability may be poor. In an exemplary embodiment of the present invention, the productivity may be ensured through the multi-layered structure of the composite layer.

Next, the polyimide precursor resin may be casted and dried to the first thermoplastic polyimide precursor layer to form the polyimide precursor layer. The step forming the first thermoplastic polyimide precursor layer and the step forming the polyimide precursor layer may be repeated several times. For example, when the steps is repeated two or more times, the step forming the secondary first thermoplastic polyimide precursor layer may not form the first thermoplastic polyimide precursor layer on the first copper foil layer, but the first thermoplastic polyimide precursor layer may be formed on the polyimide precursor layer.

Next, the thermoplastic polyimide precursor resin may be casted and dried on the polyimide precursor layer to form the second thermoplastic polyimide precursor layer. Next, the coating/coated composite precursor layer may be cured, by a heat treatment, into the composite precursor layer through the heat treatment.

Next, the second copper foil layer may be stacked on the second thermoplastic polyimide layer.

The total thickness of the first thermoplastic polyimide layer and the second thermoplastic polyimide layer suitably may be in the range of from about 15 to about 50% with respect to the total thickness of the composite layer and the total thickness of the polyimide layer may be in the range of from about 50 to about 85% with respect to the total thickness of the composite layer. Preferably, the total thickness of the first thermoplastic polyimide layer and the second thermoplastic polyimide layer may be in the range of from about 20 to about 40% with respect to the total thickness of the composite layer, and the total thickness of the polyimide layer may be in the range of from about 60 to about 80% with respect to the total thickness of the composite layer. Particularly, the total thickness of the first and second thermoplastic polyimide layers may be in a range of from about 30 to about 40% with respect to the total thickness of the composite layer, and accordingly the total thickness of the polyimide layer may be in a range of from about 60 to about 70% with respect to the total thickness of the composite layer.

The thicknesses of the first thermoplastic polyimide layer, the second thermoplastic polyimide layer, and the polyimide layer may be controlled by controlling the coating amount of the thermoplastic polyimide precursor resins and the polyimide precursor resins.

The step forming the first thermoplastic polyimide precursor layer and the step forming the polyimide precursor layer may be repeatedly performed 1 to 5 times. However, when n is 1, the thickness of the polyimide layer 22 coated one time becomes thick such that an appearance defect such as a bubble (blister) generation in the polyimide layer 22 during the coating and the hardening may be generated and a process speed may be reduced during drying/hardening of the thick polyimide layer, thereby deteriorating the productivity. When the repeated number of times is greater than 5, the number of coated polyimide layers may be excessively increased such that the productivity may be decreased.

The flexible printed circuit board according to another exemplary embodiment of the present invention may include the above-described flexible copper clad laminate. The flexible copper clad laminate is described above such that the repeated description is omitted.

The flexible printed circuit board according to an exemplary embodiment of the present invention may be the flexible printed circuit board used for the vehicle transmission.

EXAMPLE

The following examples illustrate the present invention in more detail. However, an exemplary embodiment below is only an exemplary embodiment of the present invention and the present invention is limited thereto.

Synthesis Example 1

As shown in Table 1 below, 110.51 g of the BAPP diamine was stirred in 1275 g of the DMAc solution to be completely dissolved under a nitrogen atmosphere, and 80.0 g of the BPDA was dividedly added as the dianhydride. Next, the stirring was continuously performed for about 24 h to manufacture the thermoplastic polyamic acid solution. When the manufactured thermoplastic polyamic acid solution was casted into the film phase of a 20 μm thickness and the film was hardened while a temperature was increased up to at a temperature of 350° C. during 60 min and was maintained for 30 min, the measured linear coefficient of thermal expansion and the tensile modulus were 61 ppm/° C. and 2.8 GPa, respectively.

Synthesis Example 2

As shown in Table 1 below, the diamine of 21.81 g of ODA and 47.12 g of PDA was stirred in 1264 g of the DMAc solution to be completely dissolved under the nitrogen atmosphere, and 120.0 g of the PMDA was dividedly added as the dianhydride. Next, the stirring was continuously performed for about 24 h to manufacture the thermosetting polyamic acid solution. When the manufactured thermosetting polyamic acid solution was casted into the film phase of the 20 μm thickness and the film was hardened while the temperature was increased up to a temperature of 350° C. for 60 minutes and was maintained for 30 min, the measured linear coefficient of thermal expansion and the tensile modulus were 11 ppm/° C. and 6.0 GPa, respectively.

TABLE 1

|  | Dianhydride 1 | Diamine 1 | Diamine 2 | DMAc | CTE (ppm/° C.) | Modulus (GPa) |
|---|---|---|---|---|---|---|
| Synthesis Example 1 | BPDA 80.0 g | BAPP 110.51 g |  | 1275 g | 61 | 2.8 |
| Synthesis Example 2 | PMDA 120.0 g | ODA 21.81 g | PDA 47.12 g | 1264 g | 11 | 6.0 |

Exemplary Embodiment 1

The process of coating and drying the TPI precursor manufactured in Synthesis Example 1 to the copper foil through the casting method and then coating and drying the PI precursor manufactured in Synthesis Example 2 through the casting method was repeated and a composite PI layer of a TPI-PI-TPI-PI-TPI structure was formed through a heat treatment, and the foil was finally stacked to manufacture the flexible copper clad laminate (FCCL).

Each thickness of both copper foil layers was about 35 μm, and the total thickness of the PI composite was about 50 μm. The total thickness of the TPI layer and the total thickness ratio of the PI layer were summarized in Table 2 below.

The measuring methods of the CTE, the modulus, the bending characteristic experiment, the adherence test after the oil contact, the dimensional stability, the bending degree of the PI composite layer, and the coefficient of thermal expansion were measured through methods below and were summarized in Table 2.

Figure 2:
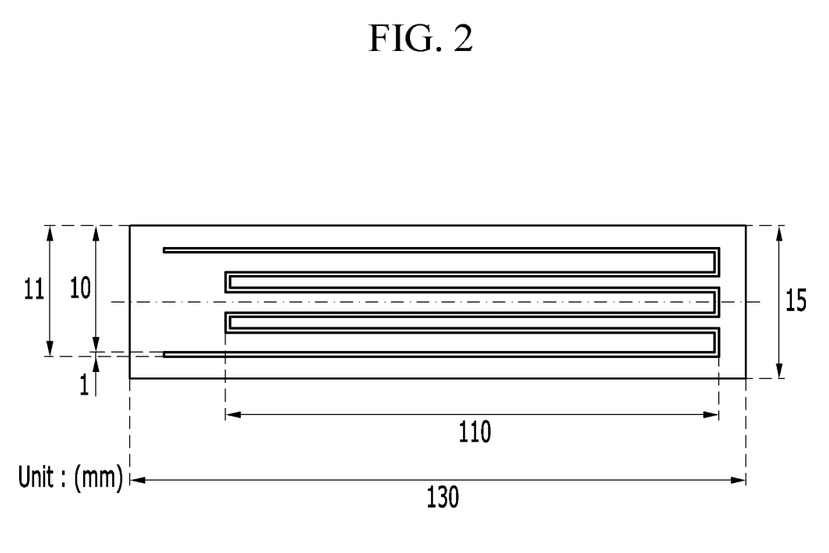
FIG. 2 shows an exemplary flexibility test method in an exemplary embodiment of the present invention.

The bending characteristic experiment (IPC TM 650): the FCCL with the size of 130 mm×15 mm as the copper foil pattern size as shown in FIG. 2 was etched, and copper plating at 35 μm was performed. While the FCCL was fixed in the state of a curvature radius R of 4 mm, the FCCL was bent by using an equipment jig and a reciprocal motion was applied at a speed of 1500 rpm at a distance of 20 mm. A point that was 20% or more compared to initial resistance was confirmed.

The adherence estimation after the oil resistance (IPC TM 650): a pattern was formed for a circuit width of 3 mm to remain in the copper foil surface of the FCCL and the copper plating of 35 μm was performed, thereby forming the total thickness of the copper foil layer of 70 μm. Next, after completely dipping the prepared pattern in transmission oil at a temperature of 160° C. for 70 h, the adhesion strength between the copper foil layer and the composite PI layer was determined. 180° adhesion strength was estimated at room temperature with a tensile speed of 50 mm/min for the copper foil layer and the composite PI layer by using a tensile tester (equipment regulated in ISO 527, Plastics—Determination of tensile properties). Peel strength when peeling the copper foil by 10 mm or greater at a minimum was applied as a result value.

The dimensional stability: A method B' of IPC-TM-650 (2.2.4) was applied. Position recognition holes were drilled at four corners of a square specimen of a mechanical direction (MD) and a width direction (TD) of 275×255 mm, the specimen was stored in a constant temperature and humidity chamber at a temperature of 23° C. and 50% RH for 24 h, and then distances between the holes were repeatedly measured three times to calculate an average thereof. Next, a film of which a metal foil was etched was stored for 30 min in an oven at a temperature of 150° C., was stored in the constant temperature and humidity chamber at a temperature of 23° C. and, 50% RH for 24 h, and the distance between the holes was again measured to calculate a dimensional change rate.

The bending degree: a flexible copper clad laminate was cut to a 100×100 mm size and was dipped in an etching solution and then a copper foil was removed to obtain a polyimide film. The polyimide film was put on a flat table to measure a maximum height of a bent or twisted part.

The coefficient of thermal expansion (CTE): the coefficient of thermal expansion was obtained by averaging values from a temperature of 100° C. to a temperature of 200° C. among thermal expansion values measured while the temperature was raised to a temperature of 400° C. at a speed of 10° C. per minute by using a thermomechanical analyzer (TMA).

Exemplary Embodiment 2

This was the same as Exemplary Embodiment 1, except for changing the total thickness of the TPI layer and the total thickness ratio of the PI layer as shown in Table 2.

Comparative Example 1

This was the same as Exemplary Embodiment 1, except for changing the total thickness of the TPI layer and the total thickness ratio of the PI layer as shown in Table 2.

Comparative Example 2

This was the same as Exemplary Embodiment 1, except for changing the total thickness of the TPI layer and the total thickness ratio of the PI layer as shown in Table 2.

Comparative Example 3

This was the same as Exemplary Embodiment 1, except for stacking the structure of the composite PI layer into the PI-TPI-PI-TPI-PI form.

Comparative Example 4

This was the same as Exemplary Embodiment 1, except for stacking the structure of the composite PI layer into the PI-TPI-PI form.

TABLE 2

| Division | Among the composite PI layers Thickness ratio of the TPI layer | CTE (ppm/° C.) of the composite PI layer | Modulus (GPa) of the composite PI layer | Bending characteristic | Adherence (kgf/cm) after the oil contact | Dimensional stability (absolute value % of a maximum value) | Bending degree (mm) after etching the copper foil |
|---|---|---|---|---|---|---|---|
| Exemplary Embodiment 1 | 40% | 30 | 4.7 | 12,000 times | >5.0 | 0.05 | 10 |
| Exemplary Embodiment 2 | 30% | 26 | 5.0 | 11,000 times | >5.0 | 0.04 | 0 |
| Comparative Example 1 | 10% | 16 | 5.7 | 7,000 times | <2.0 | 0.002 | 0 |
| Comparative Example 2 | 60% | 41 | 4.1 | 14,000 times | >5.0 | >0.1 | 30 |
| Comparative Example 3 | 40% | 30 | 4.7 | 12,000 times | <0.5 | 0.05 | 10 |
| Comparative Example 4 | 40% | 30 | 4.7 | 12,000 times | <0.5 | >0.1 | 50 |

As shown in Table 2, the FCCL manufactured in Exemplary Embodiment 1 and Exemplary Embodiment 2 had an excellent bending characteristic since the modulus of the entire composite PI layer was low, the manufacturing of the FCCL of which the dimensional stability and the product curl were low was possible, and process properties during manufacture as the circuit board were confirmed to be good.

For Comparative Example 1, since the thickness ratio of the TPI layer was low, the CTE was low and the dimensional stability was good, however it could be confirmed that the modulus was high such that the bending characteristic was low and the adherence after the oil contact was low.

For Comparative Example 2, since the thickness ratio of the TPI layer was high, the modulus of the composite PI layer was lowest, however the CTE was high such that the dimensional change rate was high, and the product curl as high such that the process properties were confirmed to be poor in the FCCL process and the manufacturing of the circuit board.

For Comparative Example 3 and Comparative Example 4, the TPI layer was coated on the outermost part of the composite PI layer such that the adherence with the copper foil layer was very much declined.

The present invention is not limited to the aforementioned exemplary embodiments, but may be manufactured in various different forms, and it will be apparent to those skilled in the art that various modifications and changes may be made thereto without departing from the scope and spirit of the invention. Therefore, it should be understood that the above exemplary embodiments are not limitative, but are illustrative in all aspects.

What is claimed is:

1. A copper clad laminate comprising
a first copper foil layer,
a composite layer,
a second copper foil layer,
wherein the first copper foil layer, the composite layer, and the second copper foil layer are sequentially stacked,
wherein the composite layer comprises a polyimide layer and a plurality of thermoplastic polyimide layers, and an outermost layer of the composite layer is one of the plurality of the thermoplastic polyimide layers,
wherein, a total thickness of the plurality of the thermoplastic polyimide layers is in a range of from about 15 to about 50% with respect to a total thickness of the composite layer, and a thickness of the polyimide layer is in a range of from about 50 to about 85% with respect to a total thickness of the composite layer,
wherein each of a thickness of the first copper foil layer and a thickness of the second copper foil layer is in a range of from about 30 to about 80 μm, and a total thickness of the composite layer is in a range of from about 40 to about 60 μm,
wherein the polyimide layer is made of n layers, the plurality of thermoplastic polyimide layers are made of (n+1) layers, and n is 2.

2. The copper clad laminate of claim 1, wherein the total thickness of the plurality of thermoplastic polyimide layers is in a range of from about 20 to about 40% with respect to the thickness of the composite layer, and the thickness of the polyimide layer is in a range of from about 60 to about 80% with respect to the thickness of the composite layer.

3. The copper clad laminate of claim 1, wherein a tensile modulus of the composite layer is in a range of from about 4.5 to about 5.5 GPa, and a linear coefficient of thermal expansion (CTE) is in a range of from about 20 to about 30 ppm/° C.

4. The copper clad laminate of claim 1, wherein the polyimide layer and the plurality of thermoplastic polyimide layers are alternately stacked.

5. A printed circuit board comprising a copper clad laminate of claim 1.

6. The printed circuit board of claim 5, wherein the printed circuit board is applied to a vehicle transmission.

7. A vehicle comprising a flexible printed circuit board of claim 5.

8. A method for manufacturing a copper clad laminate, comprising steps of:
preparing a first copper foil layer;
casting and drying a first thermoplastic polyimide precursor resin on the first copper foil layer to form a first thermoplastic polyimide precursor layer;
casting and drying a polyimide precursor resin on the first thermoplastic polyimide precursor layer to form a polyimide precursor layer;
casting and drying a second thermoplastic polyimide precursor resin on the polyimide precursor layer to form a second thermoplastic polyimide precursor layer;
curing, by a heat treatment, the first thermoplastic polyimide precursor layer, the polyimide precursor layer, and the second thermoplastic polyimide precursor layer to form a composite layer; and
stacking a second copper foil layer on the second thermoplastic polyimide layer,
wherein, a total thickness of the first thermoplastic polyimide layer and a thickness of the second thermoplastic polyimide layer is in a range of from about 15 to about 50% with respect to the total thickness of the composite layer, a total thickness of the polyimide layer is in a range of from about 50 to about 85% with respect to the total thickness of the composite layer,
each thickness of the first copper foil layer and the second copper foil layer thickness is in a range of from about 30 to about 80 μm, and the total thickness of the composite layer is in a range of from about 40 to about 60 μm, and
wherein the step forming the first thermoplastic polyimide precursor layer and the step forming the polyimide precursor layer are performed repeatedly 2 times.

9. The method of claim 8, wherein a tensile modulus of the composite layer is in a range of from about 4.5 to about 5.5 GPa, and a linear coefficient of thermal expansion (CTE) is in a range of from about 20 to about 30 ppm/° C.

10. The method of claim 8, wherein the total thickness of the first thermoplastic polyimide layer and the second thermoplastic polyimide layer is in the range of from about 20 to about 40% with respect to the total thickness of the composite layer, and the thickness of the polyimide layer is in the range of from about 60 to about 80% with respect to the total thickness of the composite layer.

* * * * *